United States Patent
Mishra et al.

(10) Patent No.: US 10,727,327 B2
(45) Date of Patent: Jul. 28, 2020

(54) SILICON CONTROLLED RECTIFIERS INTEGRATED INTO A HETEROJUNCTION BIPOLAR TRANSISTOR PROCESS

(71) Applicant: GLOBALFOUNDRIES Inc., Grand Cayman (KY)

(72) Inventors: Rahul Mishra, Essex Junction, VT (US); Vibhor Jain, Essex Junction, VT (US); Ajay Raman, Essex Junction, VT (US); Robert J. Gauthier, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 245 days.

(21) Appl. No.: 15/882,053

(22) Filed: Jan. 29, 2018

(65) Prior Publication Data

US 2019/0237568 A1     Aug. 1, 2019

(51) Int. Cl.
*H01L 29/749* (2006.01)
*H01L 29/66* (2006.01)
*H01L 29/74* (2006.01)
*H01L 27/02* (2006.01)
*H01L 29/737* (2006.01)

(52) U.S. Cl.
CPC ........ *H01L 29/749* (2013.01); *H01L 27/0248* (2013.01); *H01L 29/66242* (2013.01); *H01L 29/66371* (2013.01); *H01L 29/66393* (2013.01); *H01L 29/7404* (2013.01); *H01L 29/7436* (2013.01); *H01L 27/0255* (2013.01); *H01L 27/0262* (2013.01); *H01L 29/7371* (2013.01); *H01L 29/7378* (2013.01)

(58) Field of Classification Search
None
See application file for complete search history.

(56) References Cited

U.S. PATENT DOCUMENTS

| | | | |
|---|---|---|---|
| 6,770,918 B2 | 8/2004 | Russ et al. | |
| 6,803,259 B2 | 10/2004 | Lee | |
| 8,377,754 B1 | 2/2013 | Campi, Jr. et al. | |
| 2003/0047750 A1* | 3/2003 | Russ | H01L 27/0262 257/173 |
| 2004/0067609 A1* | 4/2004 | Lee | H01L 27/0262 438/133 |

OTHER PUBLICATIONS

Changjun et al., "A novel HBT trigger SCR in 0.35 μm SiGe BiCMOS technology", © 2016 Chinese Institute of Electronics, Journal of Semiconductors, vol. 37, No. 9.

* cited by examiner

*Primary Examiner* — Hoang-Quan Ho
(74) *Attorney, Agent, or Firm* — Thompson Hine LLP; Francois Pagette

(57) ABSTRACT

Fabrication methods and device structures for a silicon controlled rectifier. A cathode is arranged over a top surface of a substrate and a well is arranged beneath the top surface of the substrate. The cathode is composed of a semiconductor material having a first conductivity type, and the well also has the first conductivity type. A semiconductor layer, which has a second conductivity type opposite to the first conductivity type, includes a section over the top surface of the substrate. The section of the semiconductor layer is arranged to form an anode that adjoins the well along a junction.

18 Claims, 7 Drawing Sheets

US 10,727,327 B2

SILICON CONTROLLED RECTIFIERS INTEGRATED INTO A HETEROJUNCTION BIPOLAR TRANSISTOR PROCESS

BACKGROUND

The invention relates generally to semiconductor device and integrated circuit fabrication and, in particular, to device structures for a silicon controlled rectifier and methods of fabricating a device structure for a silicon controlled rectifier.

An integrated circuit may be exposed to random electrostatic discharge (ESD) events that can direct potentially large and damaging ESD currents to the integrated circuits of the chip. An ESD event refers to an electrical discharge of a current (positive or negative) over a short duration and during which a large amount of current is directed to the integrated circuit. The high current may originate from a variety of sources, such as the human body, a machine component, a carrier, etc.

Precautions may be taken to avoid causing ESD events or to protect an integrated circuit from ESD events. One such precaution is to incorporate an ESD prevention circuit into the chip. The ESD protection circuit prevents damage to sensitive devices of the integrated circuit during post-manufacture chip handling and after chip installation on a circuit board or other carrier. If an ESD event occurs, the ESD protection circuit triggers an ESD protection device, such as a silicon-controlled rectifier, to enter a low-impedance state that conducts ESD current to ground and away from the sensitive devices of the integrated circuit. The ESD protection device clamps the ESD protection device in its low-impedance state until the ESD current is drained and the ESD voltage is discharged to an acceptable level.

One type of protection device that can be deployed in an ESD protection circuit is a silicon-controlled rectifier (SCR). The SCR is a unidirectional four-layer solid state device utilized in current control applications and includes three electrodes or terminals, namely an anode, a cathode, and a gate, that are distributed among the four layers. In its quiescent state, the SCR restricts current conduction to leakage current. However, a signal applied to the gate that causes the gate-to-cathode voltage to exceed an engineered threshold, known as the trigger voltage, can initiate the conduction of a forward current between the anode and cathode. In response to the triggering signal being removed from the gate, the SCR continues to conduct the forward current so long as the conducted current remains above an engineered holding current. When the conducted current drops below the holding current, the SCR returns to its quiescent state.

Improved fabrication methods and device structures for a silicon controlled rectifier are needed.

SUMMARY

In an embodiment of the invention, a structure is provided for a silicon-controlled rectifier. The structure includes a cathode arranged over a top surface of a substrate and a well beneath the top surface of the substrate. The cathode is composed of a semiconductor material having a first conductivity type, and the well also has the first conductivity type. A semiconductor layer, which has a second conductivity type opposite to the first conductivity type, includes a section over the top surface of the substrate. The section of the semiconductor layer is arranged to form an anode that adjoins the well along a junction.

In an embodiment of the invention, a method is provided for forming a structure for a silicon-controlled rectifier. The method includes forming a well beneath a top surface of a substrate, and forming a cathode arranged over the top surface of the substrate. The method further includes epitaxially growing a section of a semiconductor layer on the top surface of the substrate. The well has a first conductivity type, the cathode is composed of a semiconductor material having the first conductivity type, the first semiconductor layer has a second conductivity type opposite to the first conductivity type, and the section of the semiconductor layer is arranged to form an anode that adjoins the well along a junction.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
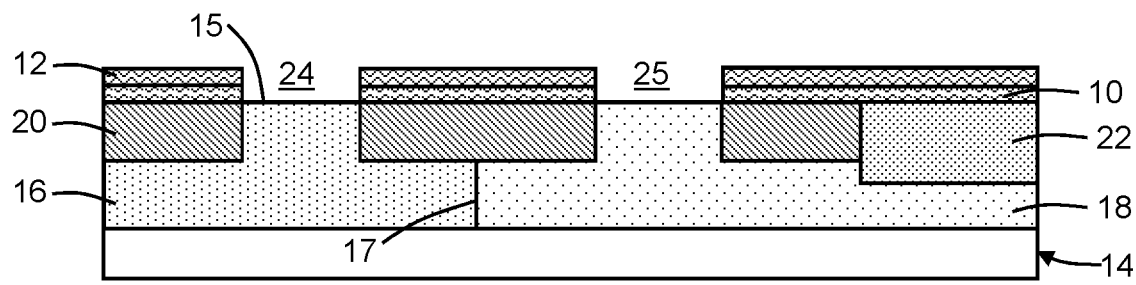
FIGS. 1-8 and FIGS. 1A-8A are cross-sectional views of a device structure at successive fabrication stages of a processing method in accordance with embodiments of the invention.
Figure 1A:
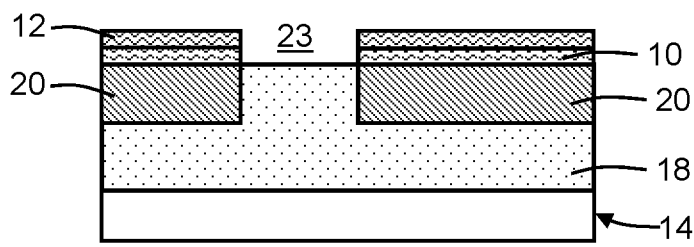

With reference to FIGS. 1, 1A and in accordance with an embodiment of the invention, juxtaposed wells 16, 18 are formed in a semiconductor layer 14 and abut along a p-n junction 17. The semiconductor layer 14 may comprise a bulk substrate composed of single-crystal silicon or another semiconductor material. The well 16 may be formed beneath a top surface 15 of the semiconductor layer 14 by introducing a dopant by, for example, ion implantation that introduces a concentration of a dopant in the semiconductor layer 14. The well 18 may be formed beneath the top surface 15 of the semiconductor layer 14 by introducing a concentration of a different dopant of opposite conductivity type in semiconductor layer 14. Respective patterned implantation masks may be used to define selected areas exposed for the implantations. The implantation mask used to select the exposed area for forming well 16 is stripped after implantation, and before the implantation mask used to form well 18 is formed. Similarly, the implantation mask used to select the exposed area for forming well 18 is stripped after the implantation is performed. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

The implantation conditions (e.g., ion species, dose, kinetic energy) may be selected to tune the electrical and physical characteristics (e.g., electrical resistivity and depth profile) of the well 16. Similarly, a separate set of implantation conditions may be selected to tune the electrical and physical characteristics of the well 18. In an embodiment, the semiconductor material of the well 16 may be doped with a p-type dopant selected from Group III of the Periodic Table (e.g., boron (B) to provide p-type conductivity, and the semiconductor material of the well 18 may be doped with an n-type dopant from Group V of the Periodic Table (e.g., phosphorus (P) and/or arsenic (As)) to provide n-type conductivity.

Trench isolation regions 20 are formed in the semiconductor layer 14. The trench isolation regions 20 may be formed by a shallow trench isolation (STI) technique that relies on a lithography and dry etching process to define trenches in the semiconductor layer 14, deposits an electrical insulator to fill the trenches, and planarizes the electrical insulator relative to the top surface 15 of the semiconductor layer 14 using a chemical mechanical polishing (CMP) process. The electrical insulator may be comprised of a dielectric material, such as an oxide of silicon (e.g., silicon dioxide ($SiO_2$)), deposited by chemical vapor deposition (CVD).

A well contact region 22 is formed in the semiconductor layer 14 and, in particular, is formed in the well 18 defined in the semiconductor layer 14. The well contact region 22, which may be formed by ion implantation, has the same conductivity type as the well 18, but at a higher dopant concentration that provides a higher electrical conductivity.

Pad layers 10, 12 are formed over the top surface 15 of semiconductor layer 14. The materials of the pad layers 10, 12 may be chosen to etch selectively to the semiconductor material of the semiconductor layer 14 and to be readily removed at a subsequent fabrication stage. The pad layers 10, 12 operate as protection layers for the top surface 15 of the semiconductor layer 14 during, for example, etching processes. Pad layer 10 may be composed of a dielectric material, such as silicon nitride ($Si_3N_4$) deposited by chemical vapor deposition (CVD). Pad layer 12 may be composed of a dielectric material, such as silicon dioxide ($SiO_2$) grown by oxidizing the top surface 15 of semiconductor layer 14 or deposited by chemical vapor deposition (CVD).

The pad layers 10, 12 are patterned to define openings or trenches 24, 25 that penetrate through the full thickness of both of the pad layers 10, 12 to the top surface 15 of the semiconductor layer 14. The pad layers 10, 12 may be patterned to form a hardmask by applying a photoresist layer (not shown) on the pad layer 12, lithographically patterning the photoresist layer to define an opening in the patterned photoresist layer, and transferring the opening from the photoresist layer to the pad layers 10 and 12 with an etching process. The photoresist layer may be stripped after the trenches 24, 25 are formed in the pad layers 10 and 12, followed by a cleaning process.

As best shown in FIG. 1A, a section of the well 18 is formed in a different device region of the semiconductor layer 14, and another trench 23 is formed that extends through the pad layers 10, 12 to the top surface 15 of the semiconductor layer 14 and the underlying well 18.

Figure 2:
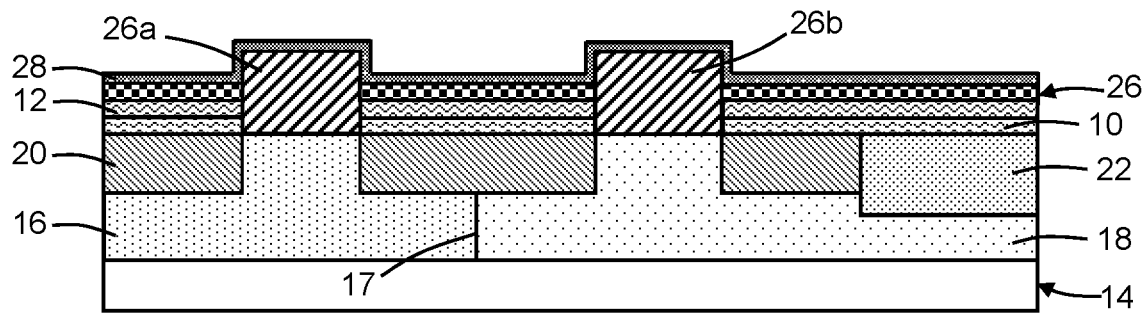
Figure 2A:
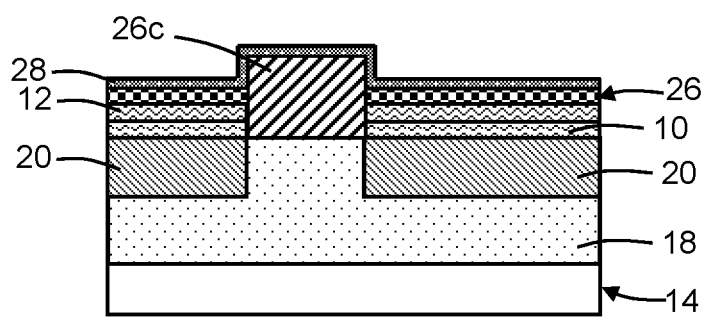

With reference to FIGS. 2, 2A in which like reference numerals refer to like features in FIGS. 1, 1A and at a subsequent fabrication stage of the processing method, a semiconductor layer 26 is formed as sections 26a, 26b of single-crystal semiconductor material on the top surface 15 of the semiconductor layer 14 respectively inside the trenches 24, 25 and as an additive layer of polycrystalline semiconductor material over the pad layers 10, 12. The semiconductor layer 26 may be comprised of a semiconductor material, such silicon (Si). Alternatively, the semiconductor layer 26 may include silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the semiconductor layer 26 may be graded and/or stepped across the thickness of semiconductor layer 26. If the germanium content is stepped, thicknesses of the semiconductor layer 26, such as respective thicknesses at its top and bottom surfaces, may lack any germanium content and may instead be entirely comprised of silicon.

The semiconductor layer 26 may be formed using a low temperature epitaxial (LTE) growth process, such as vapor phase epitaxy (VPE). During epitaxial growth, the semiconductor material constituting the sections 26a, 26b of the semiconductor layer 26 will acquire the crystal orientation and crystal structure of the single-crystal semiconductor material of the semiconductor layer 14, which serves as an epitaxial growth template establishing a crystal structure. The single-crystal sections 26a, 26b of the semiconductor layer 26 inside the trenches 24, 25 is thicker than the additive semiconductor layer 26 in the field on the pad layers 10, 12.

The semiconductor layer 26 may be doped during its growth with a dopant. In an embodiment, the semiconductor material of the semiconductor layer 26 may be doped with a p-type dopant selected from Group III of the Periodic Table (e.g., boron (B)) to provide p-type conductivity. The single-crystal section 26b of the semiconductor layer 26 abuts the well 18, which has the opposite conductivity type, along a p-n junction 27.

A dielectric layer 28 is formed on a top surface of semiconductor layer 26 and conformally follows the contour of the dielectric layer 28, which originates from the multiple thicknesses of the semiconductor layer 14. The dielectric layer 28 may be comprised of an electrical insulator with a dielectric constant (e.g., a permittivity) characteristic of a dielectric material. In one embodiment, the dielectric layer 28 may be comprised of a high temperature oxide of silicon (e.g., silicon dioxide ($SiO_2$)) deposited using, for example, a rapid thermal oxidation (RTO) process.

As best shown in FIG. 2A, the semiconductor layer 26 and the dielectric layer 28 are concurrently formed in the different device region. A single-crystal section 26c of the semiconductor layer 26, which concurrently formed with single-crystal sections 26a, 26b, provides an intrinsic base layer of a bipolar junction transistor or heterojunction bipolar transistor depending on its composition. The dielectric layer 28, which is formed after the semiconductor layer 26 is formed, provides a base isolation layer of the bipolar junction transistor or heterojunction bipolar transistor.

Figure 3:
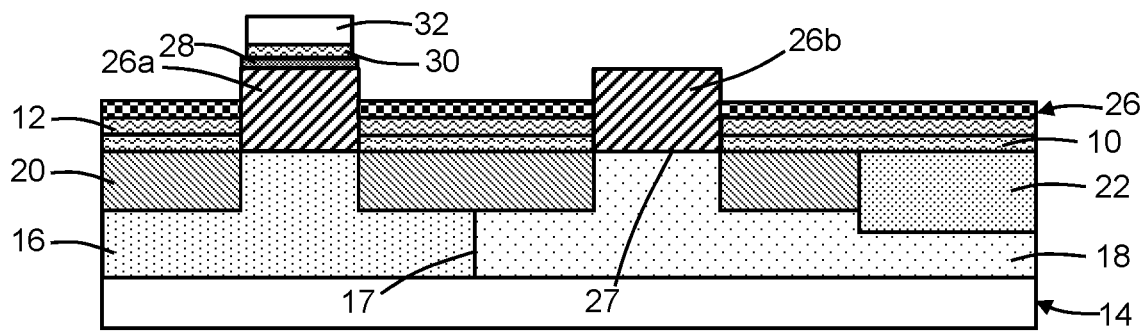
Figure 3A:
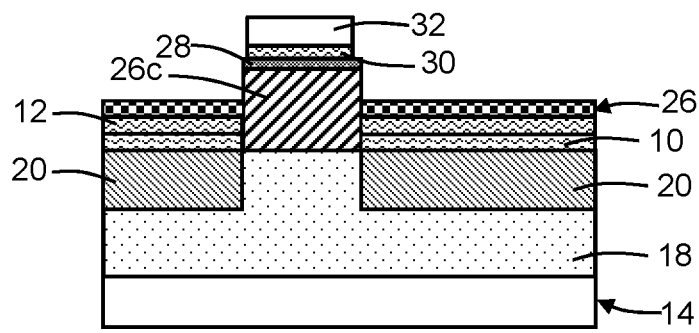

With reference to FIGS. 3, 3A in which like reference numerals refer to like features in FIGS. 2, 2A and at a subsequent fabrication stage of the processing method, a hardmask 30 is applied over the dielectric layer 28 and patterned using a lithography and etching process. During lithography, an etch mask 32 may be applied on the hardmask 30. The etch mask 32 may be comprised of a layer of a light-sensitive material, such as an organic photoresist, applied by a spin coating process, pre-baked, exposed to light projected through a photomask, baked after exposure, and developed with a chemical developer. The etch mask 32 covers a section of the hardmask 30 arranged over the single-crystal section 26a of the semiconductor layer 26, which is protected and preserved during the etching process. The single-crystal section 26b of the semiconductor layer 26 is not covered by either the etch mask 32 or a section of the patterned hardmask 30.

After the hardmask 30 is patterned, the dielectric layer 28 is patterned by an etching process, which may be a reactive ion etching (RIE) process or a wet chemical process, and is thereby removed except for a section that is masked by the section of the hardmask 30. The patterning of the dielectric layer 28 is selective to the material of the semiconductor layer 26 and exposes unmasked areas of the semiconductor layer 26. Specifically, the dielectric layer 28 is removed from the single-crystal section 26b of the semiconductor layer 26. After the dielectric layer 28 is patterned, the etch mask 32 and hardmask 30 are removed.

As best shown in FIG. 3A, the dielectric layer 28 is concurrently patterned in the different device region so that a section of the dielectric layer 28 is arranged over the single-crystal section 26c of the semiconductor layer 26.

Figure 4:
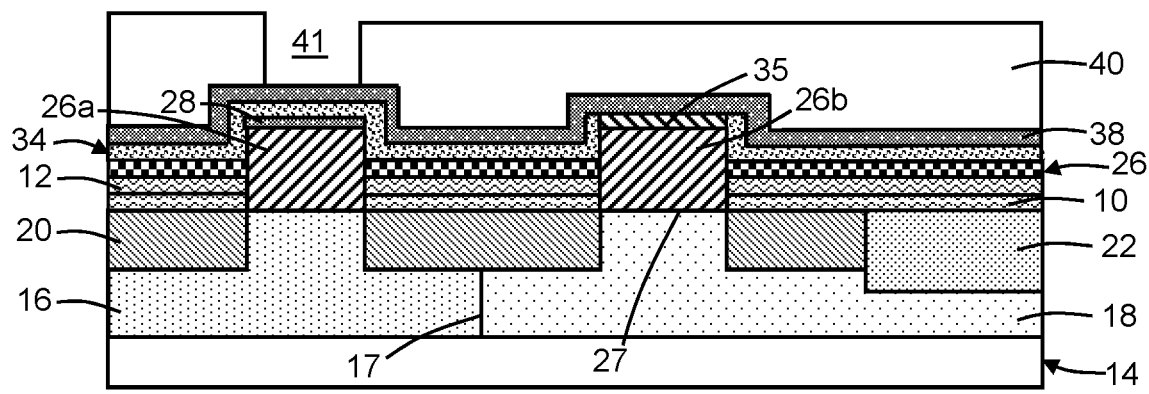
Figure 4A:
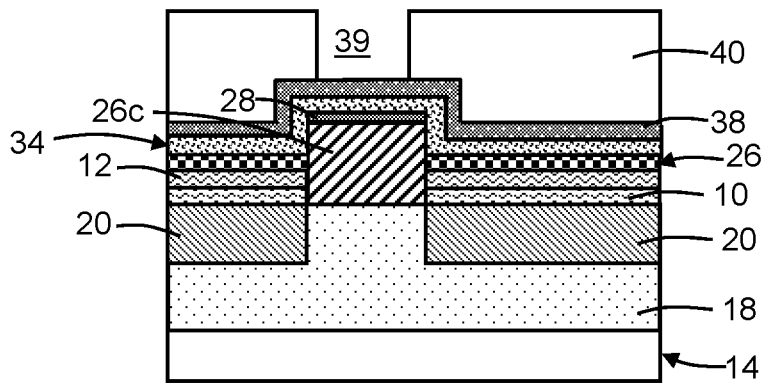

With reference to FIGS. 4, 4A in which like reference numerals refer to like features in FIGS. 3, 3A and at a subsequent fabrication stage of the processing method, a semiconductor layer 34 is formed as a section 35 of single-crystal semiconductor material on the top surface of the single-crystal section 26b of the semiconductor layer 26 and as an additive layer of polycrystalline semiconductor material over the pad layers 10, 12 and hardmask 30. The semiconductor layer 34 may be comprised of a semiconductor material, such silicon (Si). The semiconductor layer 34 may be formed using a low temperature epitaxial (LTE) growth process, such as vapor phase epitaxy (VPE). Semiconductor material in the single-crystal section 35 of the semiconductor layer 34 will acquire the crystal orientation and crystal structure of the single-crystal semiconductor material of the semiconductor layer 26. The semiconductor layer 34 may be doped during its growth with a dopant to provide semiconductor material with the same conductivity type as the semiconductor layer 26. In an embodiment, the semiconductor material of the semiconductor layer 34 may be doped with a p-type dopant selected from Group III of the Periodic Table (e.g., boron (B)) to provide p-type conductivity. The dopant concentration of semiconductor layer 34 is greater than the dopant concentration of semiconductor layer 26.

A dielectric layer 38 is formed on a top surface of the semiconductor layer 34. The dielectric layer 38 may be comprised of an electrical insulator with a dielectric constant (e.g., a permittivity) characteristic of a dielectric material. In one embodiment, the dielectric layer 38 may be comprised of a high temperature oxide of silicon (e.g., silicon dioxide ($SiO_2$)) deposited using, for example, chemical vapor deposition (CVD).

An etch mask 40 is formed over the dielectric layer 38 by applying a layer of a light-sensitive material, such as an organic photoresist by a spin coating process, pre-baking, exposure to light projected through a photomask, baking after exposure, and developing with a chemical developer to form an opening 41. The opening 41 is aligned with the single-crystal section 26a of the semiconductor layer 26.

As best shown in FIG. 4A, the semiconductor layer 34 is concurrently grown as polycrystalline semiconductor material in the different device region and furnishes an extrinsic base layer of the bipolar junction transistor or heterojunction bipolar transistor being formed in the different device area. The single-crystal section 26c of the semiconductor layer 26 inside the trench 23 is covered by the dielectric layer 28, which prevents epitaxial growth. The dielectric layer 38 is formed over the semiconductor layer 34 in the different device region. The etch mask 40 is also formed over the dielectric layer 38 and includes an opening 39 that is aligned with the single-crystal section 26c of the semiconductor layer 26.

Figure 5:
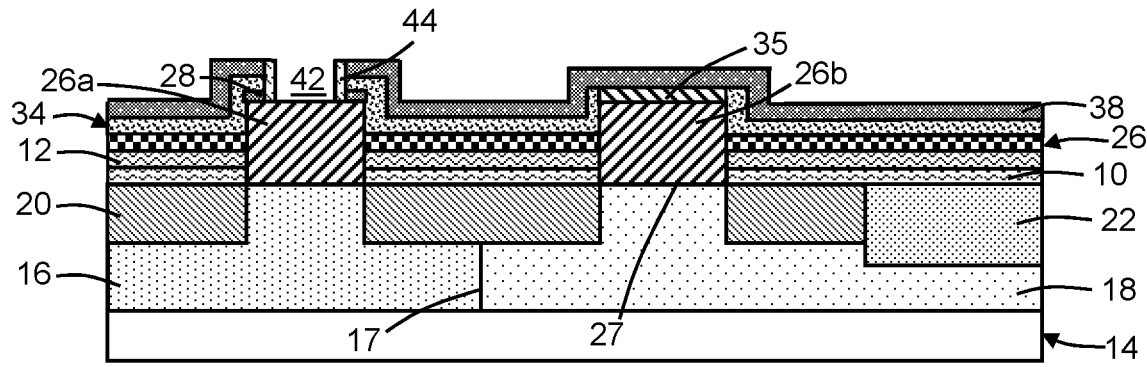
Figure 5A:
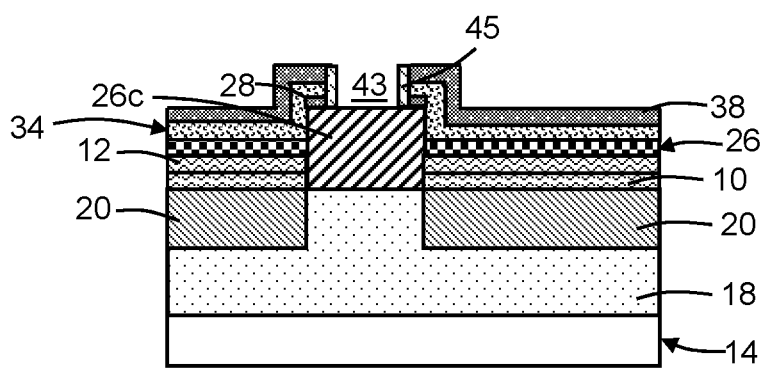

With reference to FIGS. 5, 5A in which like reference numerals refer to like features in FIGS. 4, 4A and at a subsequent fabrication stage of the processing method, an opening 42 is formed in the semiconductor layer 34 and the dielectric layer 38 at the location of the opening 41 in the etch mask 40 (FIG. 5) and the etch mask 40 is stripped. The opening 42 extends through the semiconductor layer 34 and the dielectric layer 38 to the single-crystal section 26a of the semiconductor layer 26 inside the trench 24.

Spacers 44 are formed at the sidewalls of the opening 42. The spacers 44 may be composed of a dielectric material, such as silicon nitride ($Si_3N_4$), deposited as a conformal layer by atomic layer deposition (ALD) and etched with a directional etching process, such as reactive ion etching (RIE).

As best shown in FIG. 5A, the semiconductor layer 34 and the dielectric layer 38 are concurrently patterned in the different device region to form an opening 43 that is lined by spacers 45, which are concurrently formed with the spacers 44. The opening 43 functions as an emitter opening for a subsequently-formed emitter of the bipolar junction transistor or heterojunction bipolar transistor.

Figure 6:
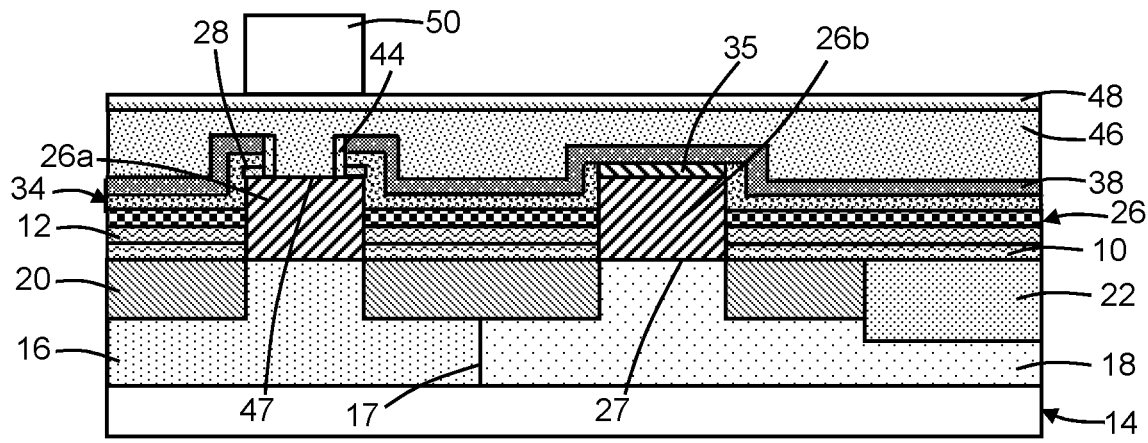
Figure 6A:
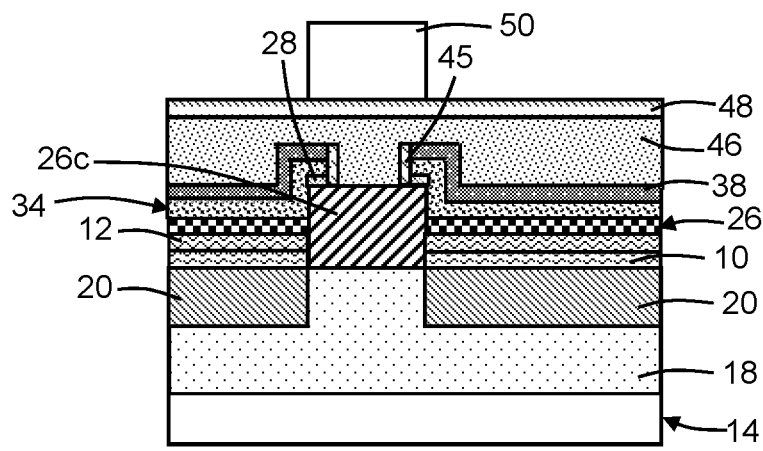

With reference to FIGS. 6, 6A in which like reference numerals refer to like features in FIGS. 5, 5A and at a subsequent fabrication stage of the processing method, a semiconductor layer 46 is formed that fills the opening 42 and covers the dielectric layer 38. The section of the semiconductor layer 46 inside the opening 42 abuts the semiconductor layer 34 along a p-n junction 47. The semiconductor layer 46 may be comprised of polycrystalline semiconductor material, such as polycrystalline silicon, deposited by chemical vapor deposition (CVD). In an embodiment, the semiconductor material of the semiconductor layer 46 may be doped with an n-type dopant from Group V of the Periodic Table (e.g., phosphorus (P) and/or arsenic (As)) to provide n-type conductivity. A dielectric layer 48 is formed over the semiconductor layer 46 and may be composed of, for example, silicon nitride ($Si_3N_4$) deposited by chemical vapor deposition (CVD). The spacers 44 electrically isolate the section of the semiconductor layer 46 inside the opening 42 from the semiconductor layer 34 surrounding the opening 42.

An etch mask 50 is formed over the dielectric layer 48 and covers a section of the semiconductor layer 46 that is arranged inside the opening 42. The etch mask 50 may be comprised of a layer of a light-sensitive material, such as an organic photoresist, applied by a spin coating process, pre-baked, exposed to light projected through a photomask, baked after exposure, and developed with a chemical developer. The etch mask 50 is absent over the single-crystal layer stack including the single-crystal section 26b of the semiconductor layer 26 and the single-crystal section 35 of the semiconductor layer 34.

As best shown in FIG. 6A, the semiconductor layer 46 is concurrently deposited in the different device region and fills the opening 42a. A section of the etch mask 50 covers a section of the semiconductor layer 46 inside the opening 42a.

Figure 7:
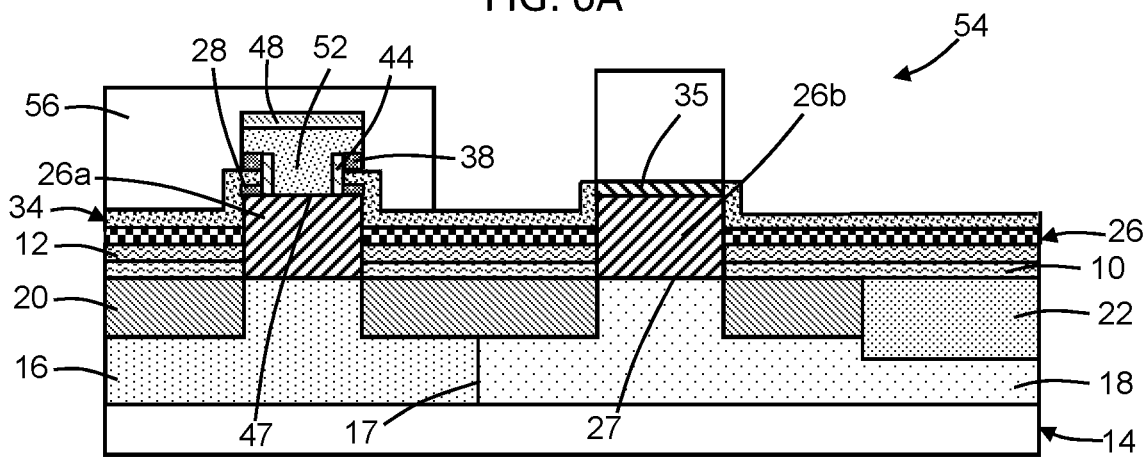
Figure 7A:
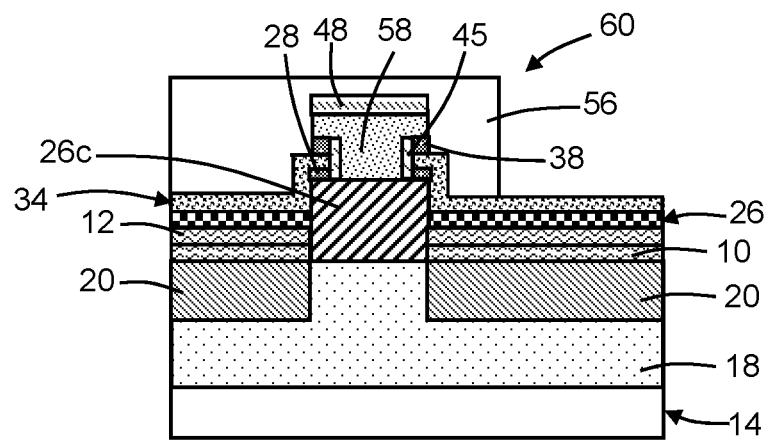

With reference to FIGS. 7, 7A in which like reference numerals refer to like features in FIGS. 6, 6A and at a subsequent fabrication stage of the processing method, a cathode 52 of a device structure 54 for a silicon controlled rectifier is formed by etching the semiconductor layer 46 with one or more etching processes, such as reactive ion etching (RIE) processes. The cathode 52 is a section of the semiconductor layer 46 that is masked by the section of the etch mask 50. The dielectric layer 38 and dielectric layer 48 are also patterned along with the semiconductor layer 46 and removed over areas that are not masked by the etch mask 50. A section of the dielectric layer 48 underlies the section of the etch mask 50 and functions as a hardmask during the etching process patterning the semiconductor layer 26 to form the cathode 52. In particular, the semiconductor layer 46 over the single-crystal section 26b of the semiconductor layer 26 is removed. The etch mask 50 is stripped, and another etch mask 56 similar to etch mask 50 is formed that covers the cathode 52 and the semiconductor layer 46 adjacent to the cathode 52, as well as the single-crystal section 26b of the semiconductor layer 26.

As best shown in FIG. 7A, the semiconductor layer 46 is concurrently patterned, when the cathode 52 is patterned, in the different device region to define an emitter 58 of a device structure 60 for a bipolar junction transistor or heterojunction bipolar transistor. The emitter 58 is coupled with the single-crystal section 26b of the semiconductor layer 26 across an emitter-base junction.

Figure 8:
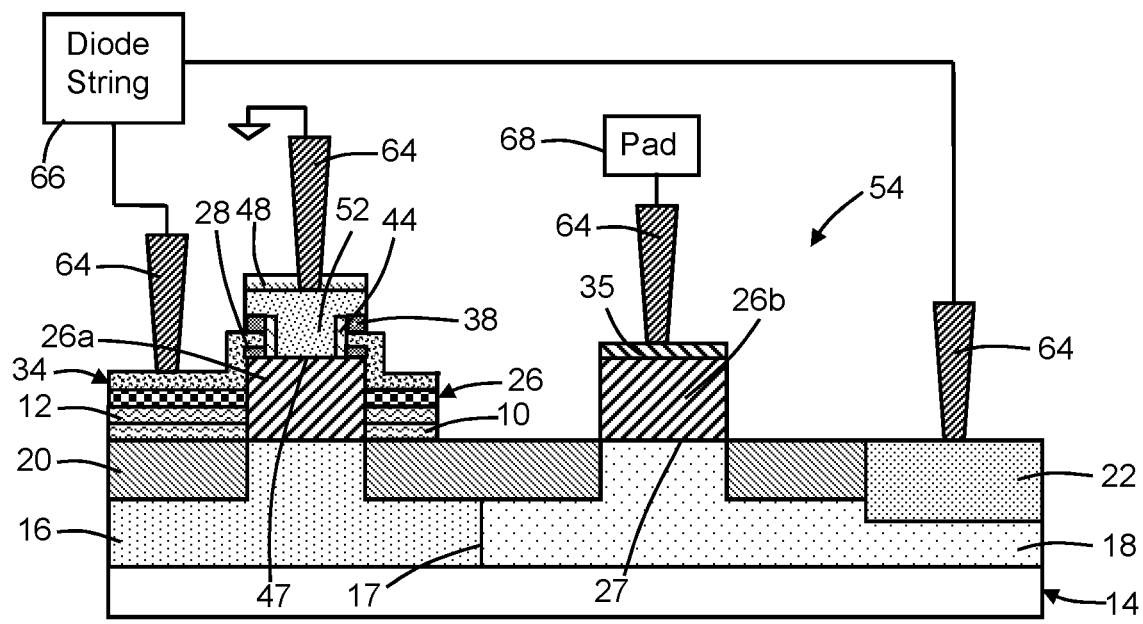
Figure 8A:
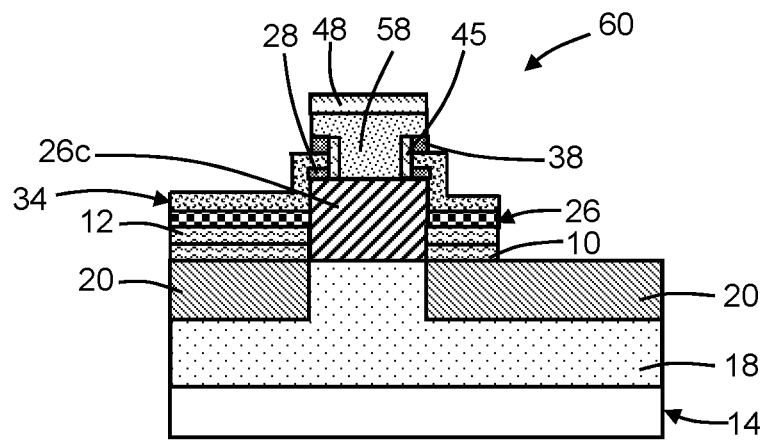

With reference to FIGS. 8, 8A in which like reference numerals refer to like features in FIGS. 7, 7A and at a subsequent fabrication stage of the processing method, the semiconductor layers 26, 34 and pad layers 10, 12 are removed over unmasked areas that not covered by the etch mask 56 with an etching process, such as reactive ion etching (RIE), using one or more etching conditions. The patterning eliminates the connection of polycrystalline semiconductor material between the single-crystal section 26a of semiconductor layer 26 from 26b and the single-crystal section 26b of semiconductor layer 26, as well as the connection between the polycrystalline semiconductor material of semiconductor layer 34 and the single-crystal section 35 of semiconductor layer 34.

Middle-of-line (MOL) processing and back-end-of-line (BEOL) processing follow, which includes formation of silicide, contacts, 64, and wiring for a MOL local interconnect structure, and formation of dielectric layers, via plugs, and wiring for a BEOL interconnect structure coupled by the local interconnect structure with the device structures 54, 60.

The device structure 54 for the silicon controlled rectifier includes p-n junctions 17, 27, 47 across each of which the conductivity type of the semiconductor material changes. The cathode 52 is coupled with ground, and the well 16 is coupled with a trigger diode string 66 by the single-crystal section 26a of semiconductor layer 26 and the polycrystalline semiconductor material of the semiconductor layer 34. The well 18 is also coupled with the trigger diode string 66 through the well contact region 22. The single-crystal section 26b of the semiconductor layer 26 functions as an anode that participates in a junction with the well 18, and that is coupled by the single-crystal section 35 of the semiconductor layer 34 with a pad 68, such as a ground pad or an input/output (I/O) pad. The single-crystal section 26b of the semiconductor layer 26 and the single-crystal section 35 of the semiconductor layer 34 are arranged above the top surface 15 of the semiconductor layer 14. The single-crystal section 26a of the semiconductor layer 26 is arranged in a vertical direction between the single-crystal section 35 of the semiconductor layer 34 and the top surface 15 of the semiconductor layer 14.

The device structure 60 for the bipolar junction transistor or heterojunction bipolar transistor is characterized by a vertical architecture that includes the well 18 as a collector, the emitter 58, and the single-crystal section 26c of the semiconductor layer 26 functioning as an intrinsic base and arranged vertically between the well 18 and emitter 58. The single-crystal section 26c adjoins the well 18 along a p-n junction. The emitter 58 adjoins the single-crystal section 26c along another p-n junction. The device structure 60 may be characterized as a heterojunction bipolar transistor (HBT) if two or all three of the collector, the intrinsic base, and the emitter 58 are comprised of different semiconductor materials (e.g., Si for the well 18 and emitter 58, and SiGe for single-crystal section 26c).

Middle-of-line (MOL) processing and back-end-of-line (BEOL) processing follow, which includes formation of silicide, contacts, and wiring for a MOL local interconnect structure, and formation of dielectric layers, via plugs, and wiring for a BEOL interconnect structure coupled by the local interconnect structure with the device structures 54 and 60.

The device structure 54 may be formed by a front-end-of-line (FEOL) process that is used to form the device structure 60. In an embodiment, the FEOL process may be a bipolar complementary metal-oxide-semiconductor (BiC-MOS) process. In another embodiment, the FEOL process may be a silicon-germanium (SiGe) process. The device structure 54 may be characterized by a high well resistance and may exhibit an improved turn-on time in comparison with conventional device structures for a silicon-controlled rectifier.

Figure 9:
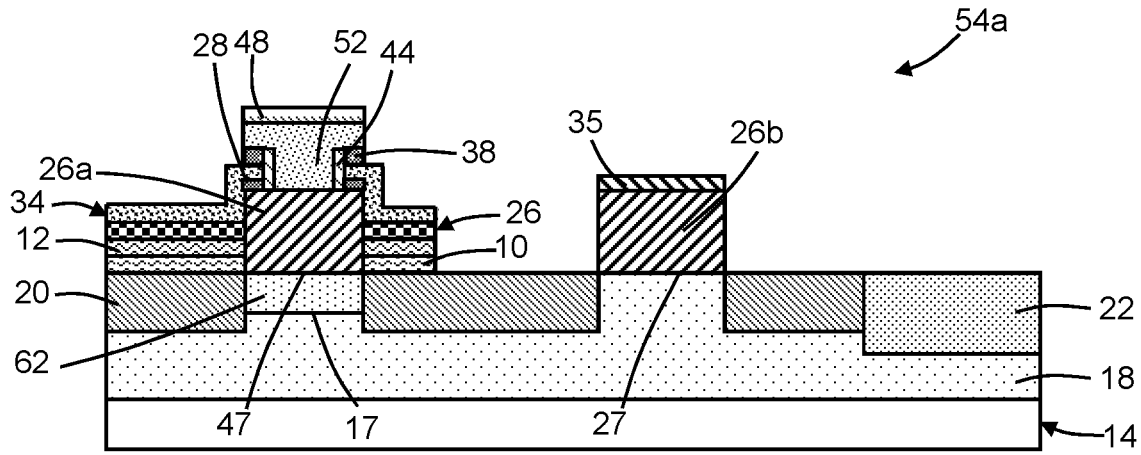
FIG. 9 is a cross-sectional view similar to FIG. 8 of a device structure in accordance with alternative embodiments of the invention.

With reference to FIG. 9 in which like reference numerals refer to like features in FIG. 8 and in accordance with alternative embodiments, the well 16 may be eliminated and the well 18 may be extended laterally beneath the cathode 52 of a modified device structure 54a. A doped region 62 is formed in the well 18 that is arranged between the well 16 and the single-crystal section 26a of semiconductor layer 26, which relocates the p-n junction 17. The doped region 62 may be formed by ion implantation before the semiconductor layer 26 is formed, and may be doped to have the same conductivity type as the semiconductor layer 26. In an embodiment, the doped region 62 may be doped with a p-type dopant selected from Group III of the Periodic Table (e.g., boron) to provide p-type conductivity.

Figure 10:
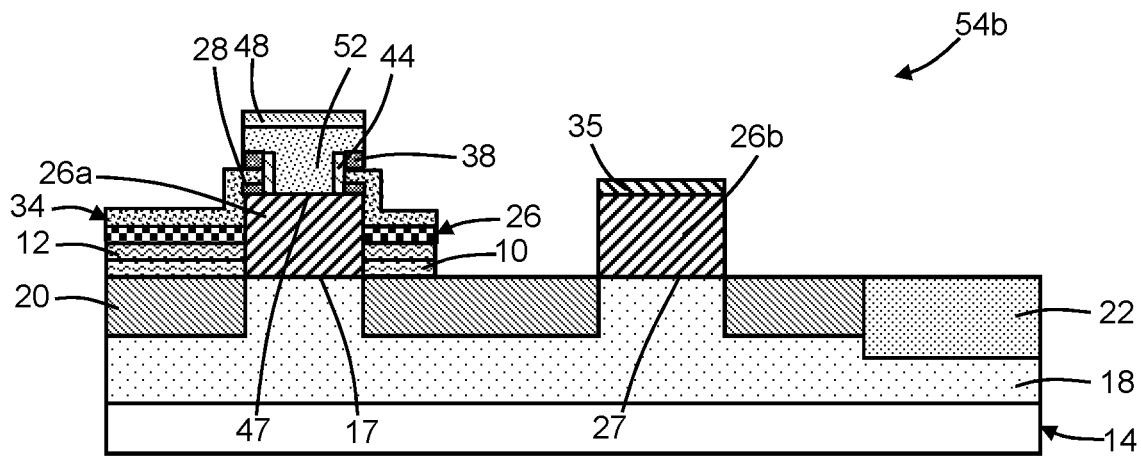
FIG. 10 is a cross-sectional view similar to FIG. 8 of a device structure in accordance with alternative embodiments of the invention.

With reference to FIG. 10 in which like reference numerals refer to like features in FIG. 8 and in accordance with alternative embodiments, the well 16 may be eliminated and the well 18 may be extended laterally beneath the cathode 52 of a modified device structure 54b. The p-n junction 17 is arranged at the interface between the well 16 and the single-crystal section 26a of semiconductor layer 26.

Figure 11:
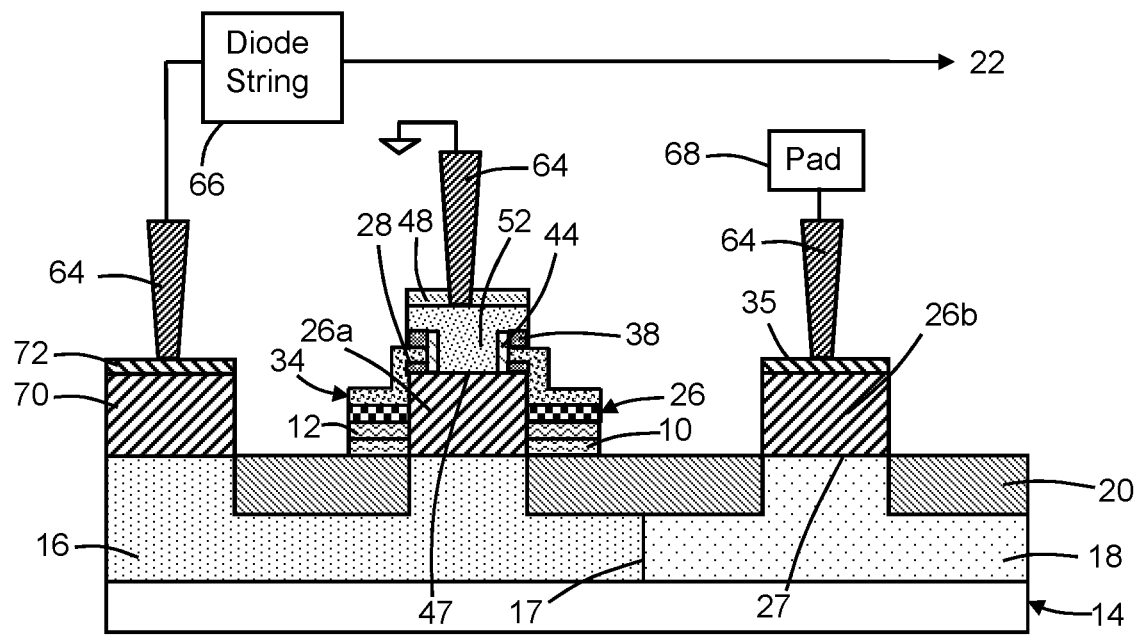
FIG. 11 is a cross-sectional view similar to FIG. 8 of a device structure in accordance with alternative embodiments of the invention.

With reference to FIG. 11 in which like reference numerals refer to like features in FIG. 8 and in accordance with alternative embodiments, another trench (not shown) similar to trenches 24 and 25 (FIG. 1) may be formed that penetrates through the full thickness of both of the pad layers 10, 12 to the top surface 15 of the semiconductor layer 14. When the semiconductor layer 26 is formed (FIG. 2), another section 70 of single-crystal semiconductor material similar to sections 26a, 26b is epitaxially grown on the top surface 15 of the semiconductor layer 14 inside the additional trench. When the semiconductor layer 34 is formed (FIG. 4), another section 72 of single-crystal semiconductor material similar to single-crystal section 35 is epitaxially grown on the top surface of the single-crystal section 70 of the semiconductor layer 26. The semiconductor layers 26, 34 and pad layers 10, 12 are etched and removed (FIG. 8) over an unmasked area between the cathode 52 and the sections 70, 72 that is not covered by the etch mask 56. The contact 64 to the well 16 is made through the sections 70, 72.

Figure 12:
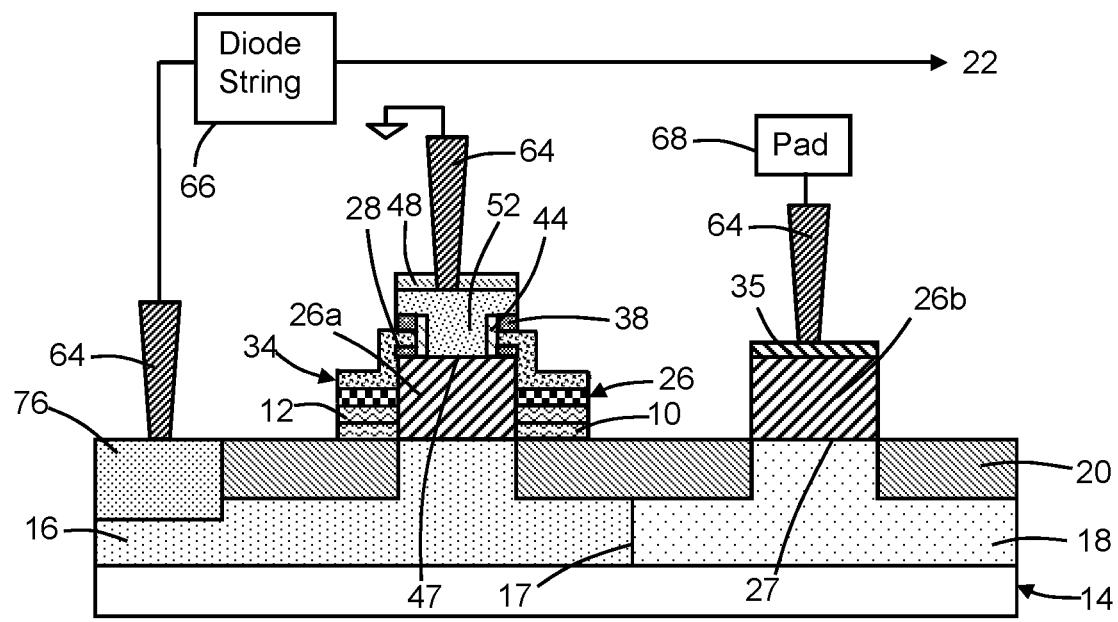
FIG. 12 is a cross-sectional view similar to FIG. 8 of a device structure in accordance with alternative embodiments of the invention.

With reference to FIG. 12 in which like reference numerals refer to like features in FIG. 8 and in accordance with alternative embodiments, a well contact region 76 is formed in the semiconductor layer 14 and, in particular, is formed in the well 16 defined in the semiconductor layer 14. The well contact region 76, which may be formed by ion implantation, has the same conductivity type as the well 16, but at a higher dopant concentration that produces a higher electrical conductivity. The contact 64 to the well 16 is made through the well contact region 76.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product. For example, the field-effect transistor and/or handle wafer contact in the embodiments described herein may be used in a switch, a low noise amplifier, or a logic circuit.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" or "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a silicon-controlled rectifier, the structure comprising:

a cathode arranged over a top surface of a substrate, the cathode comprised of a semiconductor material having a first conductivity type;

a first well beneath the top surface of the substrate, the first well having the first conductivity type;

a first semiconductor layer having a second conductivity type opposite to the first conductivity type, the first semiconductor layer including a first section over the top surface of the substrate and a second section arranged between the top surface of the substrate and the cathode, and the first section of the first semiconductor layer arranged to form an anode of the silicon-controlled rectifier that adjoins the first well along a first junction; and a second well beneath the top surface of the substrate, the second well having the second conductivity type and adjoining the first well along a second junction, wherein the cathode and the second section of the first semiconductor layer are arranged over the second well, and the cathode and the second section of the first semiconductor layer define a third junction.

2. The structure of claim 1 further comprising:

a second semiconductor layer of the second conductivity type, the second semiconductor layer including a first section arranged over the top surface of the substrate on the first section of the first semiconductor layer, wherein the second semiconductor layer has a higher dopant concentration than the first semiconductor layer.

3. The structure of claim 2 wherein the second semiconductor layer includes a second section extending laterally relative to the cathode from the second section of the first semiconductor layer.

4. A structure for a silicon-controlled rectifier, the structure comprising:

a cathode arranged over a top surface of a substrate, the cathode comprised of a semiconductor material having a first conductivity type;

a first well beneath the top surface of the substrate, the first well having the first conductivity type; and a first semiconductor layer having a second conductivity type opposite to the first conductivity type, the first semiconductor layer including a first section over the top surface of the substrate, and the first section of the first semiconductor layer arranged to form an anode that adjoins the first well along a first junction; and a second semiconductor layer of the second conductivity type, the second semiconductor layer including a first section arranged over the top surface of the substrate on the first section of the first semiconductor layer wherein the second semiconductor layer includes a second section extending laterally relative to the cathode from the second section of the first semiconductor layer, the second semiconductor layer has a higher dopant concentration than the first semiconductor layer, the first section of the second semiconductor layer includes a single-crystal semiconductor material, and the second section of the second semiconductor layer includes a polycrystalline semiconductor material.

5. The structure of claim 3 further comprising:

a first contact coupled to the first section of the second semiconductor layer; and a second contact coupled to the second section of the second semiconductor layer, wherein the first contact and the second contact are arranged over the top surface of the substrate.

6. The structure of claim 1 further comprising:

a trench isolation region in the substrate, wherein the first well and the second well extend in the substrate beneath the trench isolation region, and the second junction is arranged beneath the trench isolation region.

7. The structure of claim 1 wherein the first semiconductor layer includes a third section arranged to contact the second well, and the first section, the second section, and the third section of the first semiconductor layer includes a single-crystal semiconductor material.

8. The structure of claim 1 wherein the first semiconductor layer is composed of silicon-germanium.

9. A method of forming a structure for a silicon-controlled rectifier, the method comprising:
   forming a first well beneath a top surface of a substrate;
   forming a second well beneath the top surface of the substrate;
   forming a cathode arranged over the top surface of the substrate; and
   epitaxially growing a first section and a second section of a first semiconductor layer on the top surface of the substrate,
   wherein the first well has a first conductivity type, the cathode is composed of a semiconductor material having the first conductivity type, the first semiconductor layer has a second conductivity type opposite to the first conductivity type, the first section of the first semiconductor layer is arranged to form an anode that adjoins the first well along a first junction, the second section of the first semiconductor layer is arranged between the top surface of the substrate and the cathode, the second well has the second conductivity type and adjoins the first well along a second junction, the cathode and the second section of the first semiconductor layer are arranged over the second well, and the cathode and the second section of the first semiconductor layer define a third junction.

10. The method of claim 9 further comprising:
   epitaxially growing a first section of a second semiconductor layer on the first section of the first semiconductor layer,
   wherein the second semiconductor layer has the second conductivity type, and the second conductivity type of the second semiconductor layer has a higher dopant concentration than the first semiconductor layer.

11. The method of claim 10 wherein the second semiconductor layer includes a second section extending laterally relative to the cathode from the second section of the first semiconductor layer.

12. The method of claim 11 further comprising:
   forming a first contact coupled to the first section of the second semiconductor layer; and
   forming a second contact coupled to the second section of the second semiconductor layer,
   wherein the first contact and the second contact are arranged over the top surface of the substrate.

13. The structure of claim 1 wherein the first semiconductor layer includes a third section arranged to contact the first well, and further comprising:
   a heterojunction bipolar transistor,
   wherein the third section of the first semiconductor layer comprises an intrinsic base of the heterojunction bipolar transistor.

14. The structure of claim 13 wherein the first section, the second section, and the third section of the first semiconductor layer includes a single-crystal semiconductor material.

15. The structure of claim 7 further comprising:
   a contact coupled to the second well by the third section of the first semiconductor layer.

16. The structure of claim 1 wherein the first conductivity type is n-type, and the second conductivity type is p-type.

17. The method of claim 9 wherein the first conductivity type is n-type, and the second conductivity type is p-type.

18. The structure of claim 2 wherein the first section of the second semiconductor layer includes a single-crystal semiconductor material, and the second section of the second semiconductor layer includes a polycrystalline semiconductor material.

* * * * *